(12) United States Patent
Lin et al.

(10) Patent No.: US 8,129,206 B2
(45) Date of Patent: Mar. 6, 2012

(54) LIGHT EMITTING DIODE PACKAGE AND METHOD OF MAKING THE SAME

(75) Inventors: Hung-Yi Lin, Tao-Yuan Hsien (TW); Kuan-Jui Huang, Kao-Hsiung Hsien (TW); Yen-Ting Kung, Taoyuan County (TW); She-Fen Tien, Hsinchu County (TW)

(73) Assignee: Touch Micro-System Technology Corp., Taoyuan Hsien (TW)

( * ) Notice: Subject to any disclaimer, the term of this patent is extended or adjusted under 35 U.S.C. 154(b) by 311 days.

(21) Appl. No.: 12/481,549

(22) Filed: Jun. 9, 2009

(65) Prior Publication Data

US 2010/0090245 A1    Apr. 15, 2010

(30) Foreign Application Priority Data

Oct. 13, 2008  (TW) ................. 97139170 A

(51) Int. Cl.
*H01L 33/00* (2010.01)

(52) U.S. Cl. .............. 438/27; 257/E33.067; 257/100

(58) Field of Classification Search ............ 257/100; 438/27

See application file for complete search history.

(56) References Cited

U.S. PATENT DOCUMENTS

| 7,514,867 | B2 * | 4/2009 | Yano et al. | 313/512 |
| 7,642,707 | B2 * | 1/2010 | Luettgens et al. | 313/501 |
| 7,795,055 | B2 * | 9/2010 | Lee et al. | 438/29 |
| 2009/0261358 | A1 * | 10/2009 | Chitnis et al. | 257/88 |

FOREIGN PATENT DOCUMENTS

WO    2008044759 A1    4/2008

* cited by examiner

*Primary Examiner* — Jerome Jackson, Jr.
(74) *Attorney, Agent, or Firm* — Chen Yoshimura LLP

(57) ABSTRACT

The light emitting diode package of the present invention uses photosensitive materials to form phosphor encapsulations or a phosphor layer, which can be fabricated by means of semiconductor processes in batch. Also, the concentration of phosphors in individual regions can be accurately and easily controlled by a laser printing process or by light-through holes. Accordingly, the optic effects of light emitting diode packages can be accurately adjusted.

10 Claims, 11 Drawing Sheets

LIGHT EMITTING DIODE PACKAGE AND METHOD OF MAKING THE SAME

BACKGROUND OF THE INVENTION

1. Field of the Invention

The present invention relates to a light emitting diode (LED) chip package and a method of fabricating thereof, and more particularly, to an LED chip package utilizing a semiconductor substrate as a package substrate and the concentration and the distribution of phosphors of the phosphor encapsulations or the phosphor layer may be adjusted, and a method of fabricating thereof.

2. Description of the Prior Art

Please refer to FIG. 1. FIG. 1 is a schematic view illustrating a conventional glue dispensing process for forming a light emitting diode (LED) chip package. As shown in FIG. 1, the conventional LED chip package 1 includes a base 2 formed by injection molding technique, and a leadframe 3 fixed on the base 2 to form a package substrate 4. The LED chip 5 is mounted on the leadframe 3. One of the electrodes of LED chip 5 is directly electrically connected to a part of the leadframe 3 located on one side of the package substrate 4, while another electrode is electrically connected to another part of the leadframe 3 on the other side of the package substrate 4 via bonding wire 7 by wire bonding technique. Next, a glue dispensing process is performed, and package resin 6 is encapsulated onto the package substrate 4 with a glue dispensing device 8.

However, the conventional method of forming an LED chip package may lead to shortcomings such as unevenly dispersed glue, unstable provision of glue flow, difficulties in controlling the superficial flatness of glue, low efficiency of process. It is to be noted that, in the aspect of efficiency, since the conventional glue dispensing process usually may only handle one LED chip package at a time, it therefore consumes a lot of time to finish fabrication of a huge amount of the LED chip packages.

SUMMARY OF THE INVENTION

It is therefore one of the objectives of the present invention to provide an LED chip package and a method of fabricating thereof, to solve the above mentioned problems caused by the conventional method.

To achieve the above-mentioned goal, a method of fabricating an LED chip package is provided in the present invention. The method of fabricating an LED chip package includes:
- providing a substrate, and a plurality of LED chips mounted on the substrate;
- forming an phosphor layer on the substrate and the LED chips; and
- patterning the phosphor layer, so that the phosphor layer forms a plurality of phosphor encapsulations on the LED chips, each of the phosphor encapsulations has a plurality of light-through holes, and each of the light-through holes penetrates each of the phosphor encapsulations vertically.

To achieve the above-mentioned goal, a LED chip package is further provided in the present invention. The LED chip package includes:
- a substrate;
- at least an LED chip mounted on the substrate; and
- at least a phosphor encapsulation disposed on the substrate and the LED chips, where the phosphor encapsulation has a plurality of light-through holes, and each of the light-through holes penetrates each of the phosphor encapsulations vertically.

The LED chip package may utilize photosensitive materials to form phosphor encapsulations; therefore semiconductor processes may be utilized for batch production of the phosphor encapsulations and the patterning step. Since the phosphor encapsulations of the present invention further include a plurality of light-through holes, therefore the concentration of phosphors of the phosphor encapsulations or the phosphor layer may be effectively controlled. The optic effect of the LED chip packages is thus enhanced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
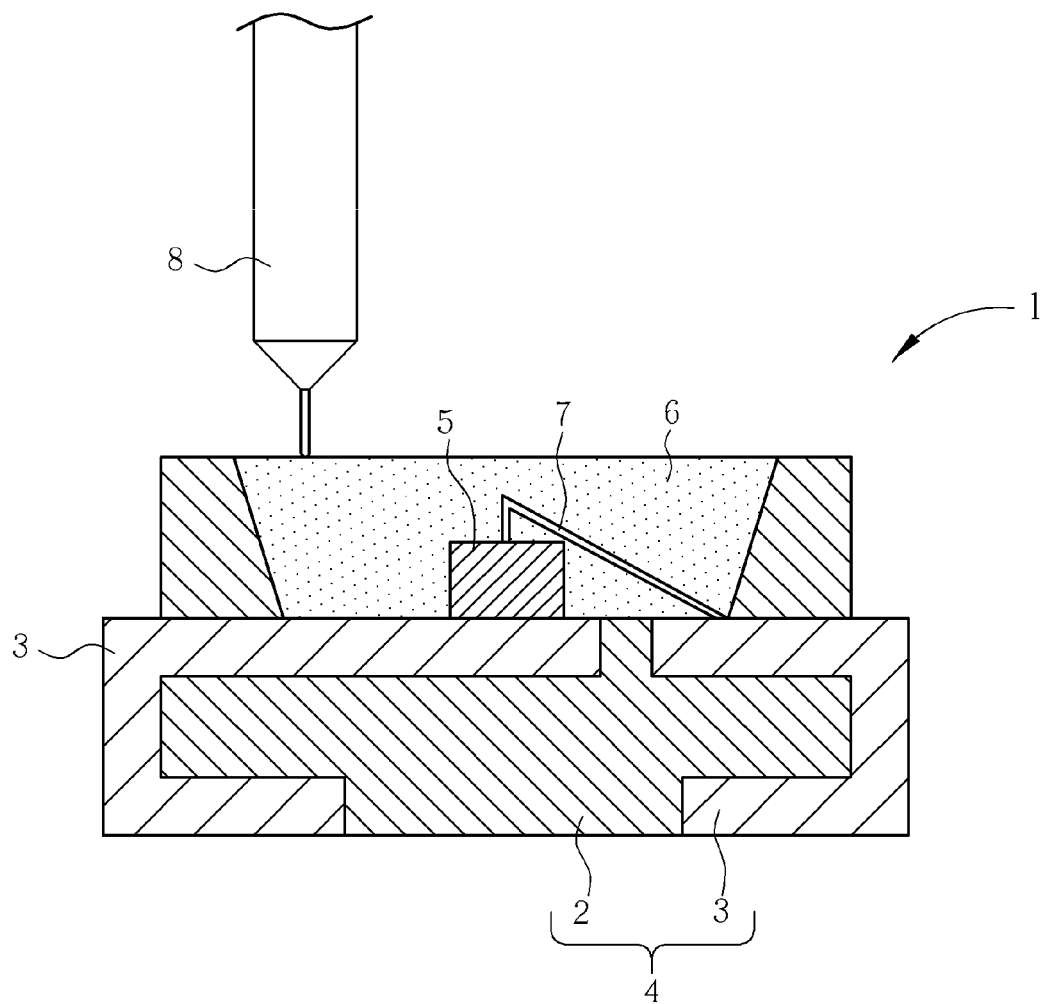
FIG. 1 is a schematic view illustrating a conventional glue dispensing process forming an LED chip package.
Figure 2A:
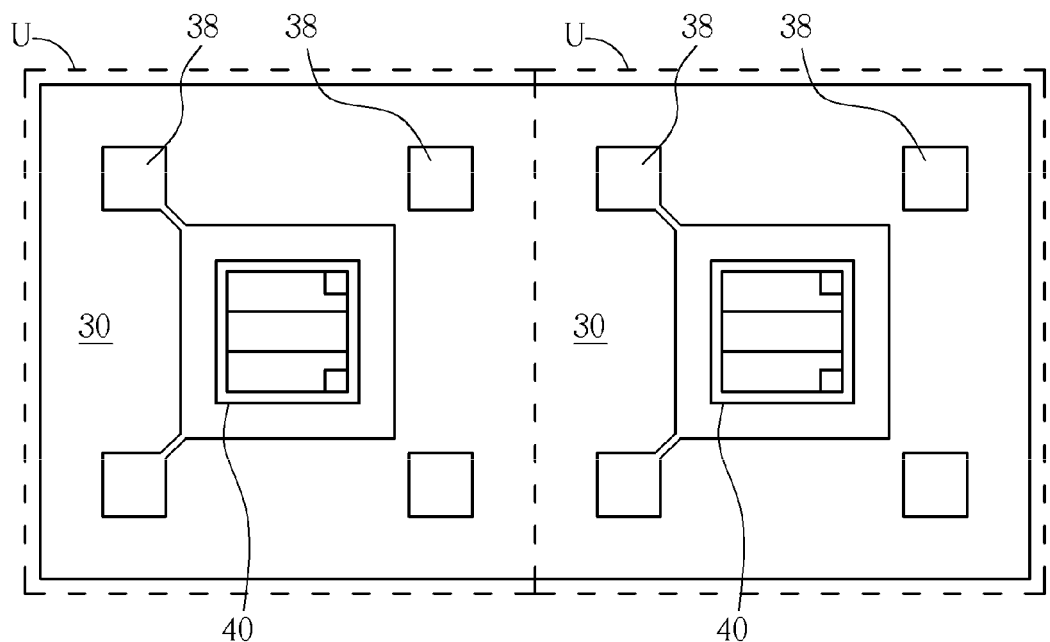
FIG. 2 to FIG. 6 are schematic views of fabricating an LED chip package according to a preferred embodiment of the present invention.
Figure 2B:
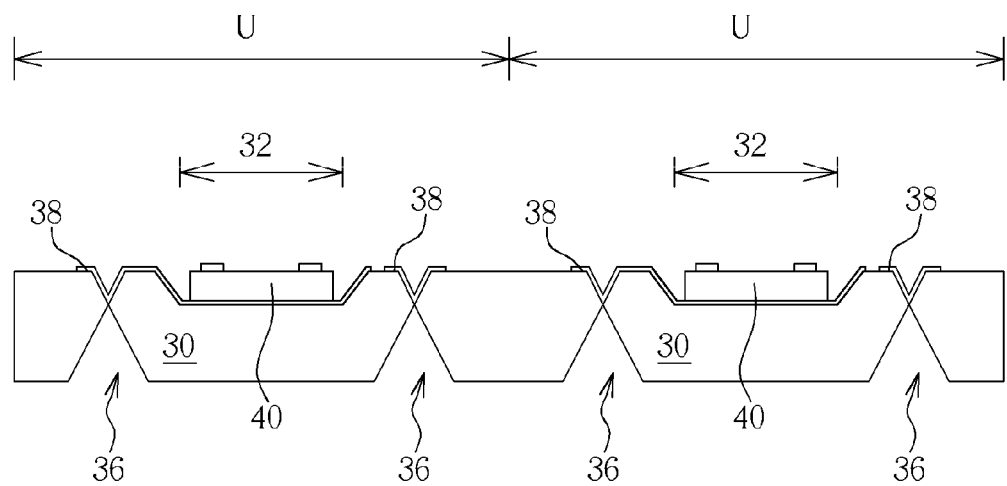

To provide a better understanding of the presented invention, preferred embodiments will be made in details. The preferred embodiments of the present invention are illustrated in the accompanying drawings with numbered elements.

Please refer to FIG. 2 to FIG. 6. FIG. 2 to FIG. 6 are schematic views of fabricating an LED chip package a preferred embodiment of in the present invention. FIG. 2a to FIG. 6 are top views, FIG. 2b to FIG. 6b are cross-sectional views, and FIG. 5c is a top view of the entire substrate 30. As shown in FIG. 2a and FIG. 2b, a substrate 30 having a plurality of units U defined thereon and a plurality of LEDs 40 are provided at first. Each of the units U is defined for disposition of the corresponding LED 40. The substrate 30 may be a semiconductor substrate. For instance, it may be preferably a silicon substrate, gallium arsenide (GaAs) substrate, or other substrates with good heat conductivity, suitable for batch production and compatible with semiconductor fabrication process. The substrate 30 may include a plurality of concave chip mounting areas 32 on its surface. The depth of the chip mounting areas 32 may preferably be approximately the height (thickness) of the LED chips that would be mounted within them. The depth is about several to several tens of micrometers (μm). For instance, the preferred depth of the chip mounting areas 32 is in between 10 μm to 50 μm, but is not limited to the above mentioned range. As described, the depth of the chip mounting areas 32 and the height of the LED chips 40 are close, and therefore the package substrate 30 and the upper surface of the LED chips 40 are substantially in the same plane.

Any appropriate electrical connection facilitating the external electrical connection of the LED chips may be utilized in the present invention. However, there are various methods of electrical connection, the detailed connection method are not illustrated in the figures. For example, utilizing a wire bonding technique to connect the conductive wires (not shown) on the substrate 30 via the bonding wire, utilizing flip-chip technique to connect the conductive wires (not shown) on the substrate 30 via welding the solder bumps or other bumps, utilizing electrical conductive adhesives, eutectic bonding or other techniques to realize the external electrical connection of the LED chips. The conductive wires 38 of the substrate 30 may electrically connect to the lower surface of the substrate 30 via the through holes 36 of the substrate 30, but not limited. Moreover, the LED chips in the present invention may be any type of LED chips such as the vertical type chips or the horizontal type chips.

Figure 3A:
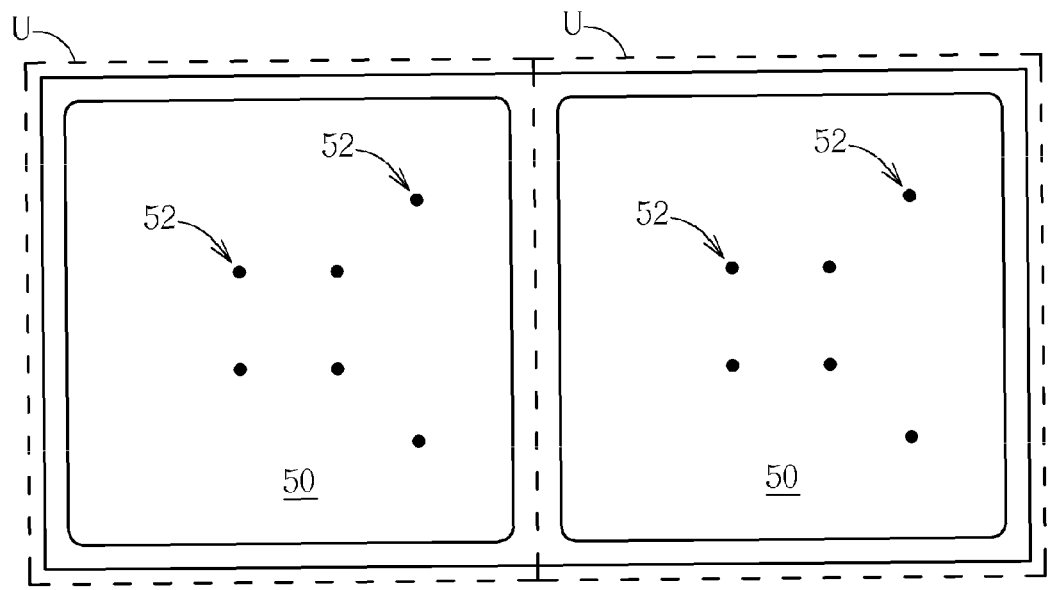
Figure 3B:
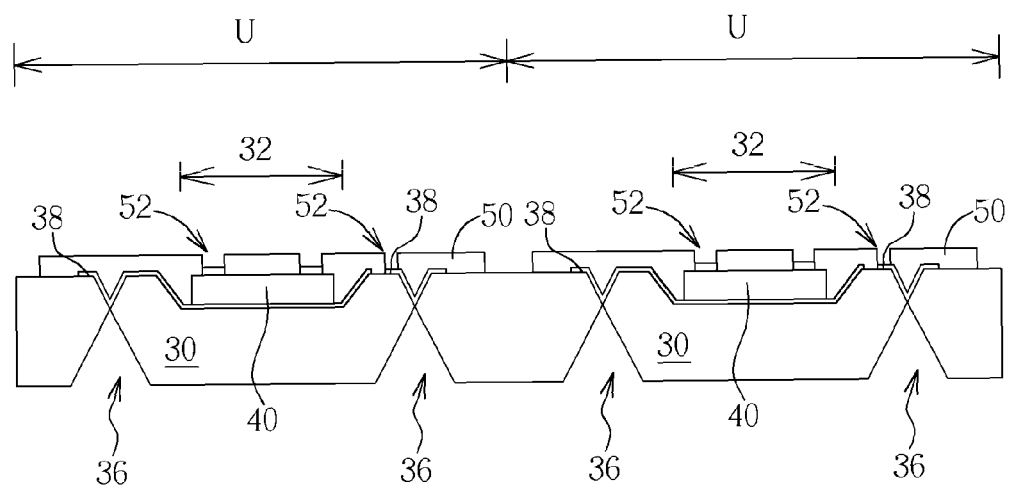

As shown in FIG. 3a and FIG. 3b, a light-penetrating planarization structure 50 may be selectively formed on the substrate 30 and the LED chips 40. The planarization structure 50 is dielectric and fills the spaces between the LED chips 40 and the chip mounting areas 32, and consequently a complete plane is formed on the package substrate 30 and the upper surface of the LED chips 40. The planarization structure 50 makes it easy to form successive conductive wires or material films thereon. Alternatively, the planarization structure 50 may further include a plurality of contact holes 52, so as to facilitate the external electrical connection of each of the LED chips 40 via the contact holes 52, but not limited.

Figure 4A:
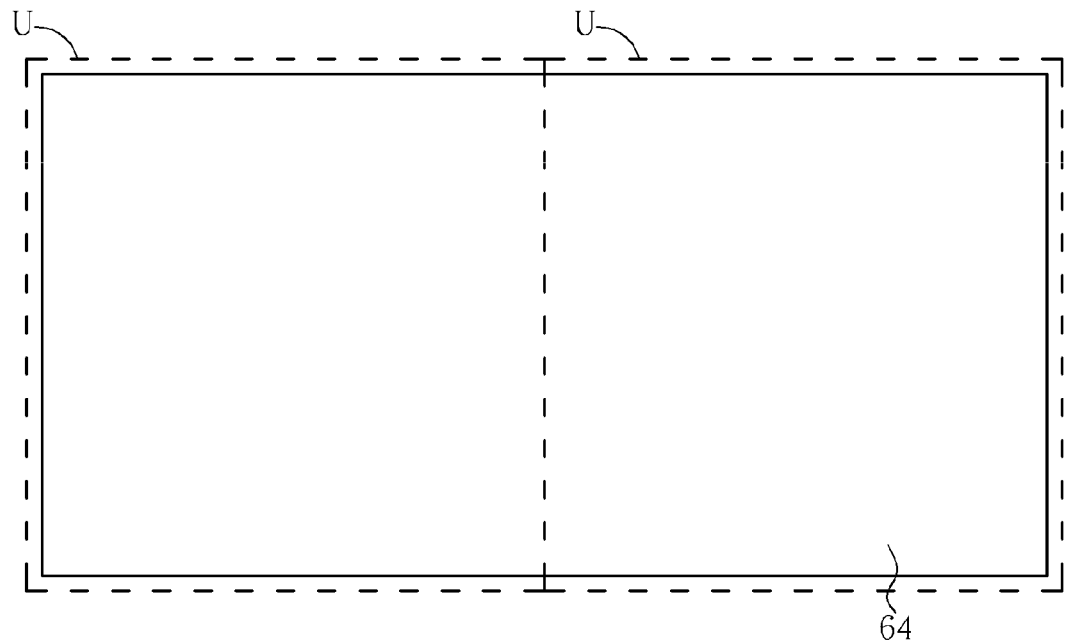
Figure 4B:
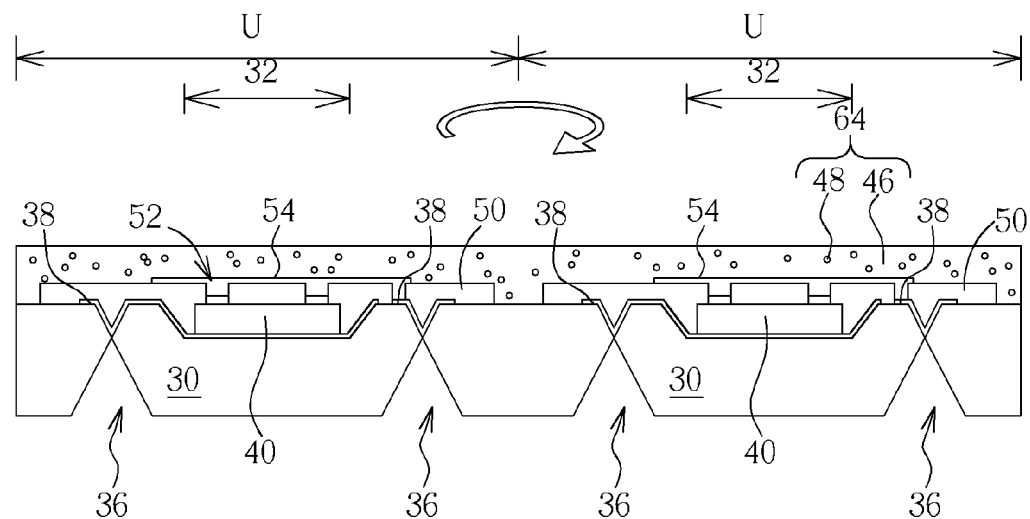

As shown in FIG. 4a and FIG. 4b, subsequently, a conductive wire 54 is formed on the planarization structure 50. The upper patterned conductive wire 54 fills the contact holes 52 to facilitate electrical connection. A spin coating process may be performed to form a phosphor layer 64 on the substrate 30, the LED chips 40 and the planarization structure 50. The phosphor layer 64 includes a photosensitive glue 46 with phosphors 48 blended in the photosensitive glue 46. It is to be noted that, the phosphors 48 are practically very tiny particles. In order to clearly present the distribution of the phosphor layer 64, the phosphors 48 are not shown in the top view drawing. The photosensitive glue 46 may include material that forms bonding after light illumination, or splits after light illumination such as photosensitive resin, and the photosensitive glue 46 preferably has well light penetrability. The phosphors 48 may include material that may change one light wave length into another light wave length such as yttrium aluminum garnet (YAG).

Figure 5A:
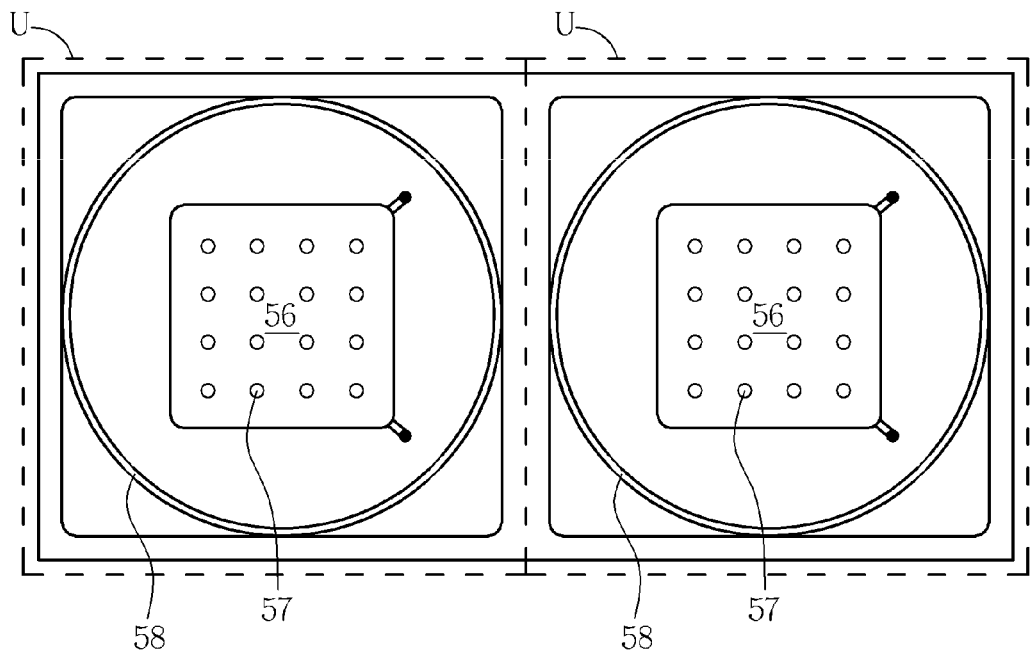
Figure 5B:
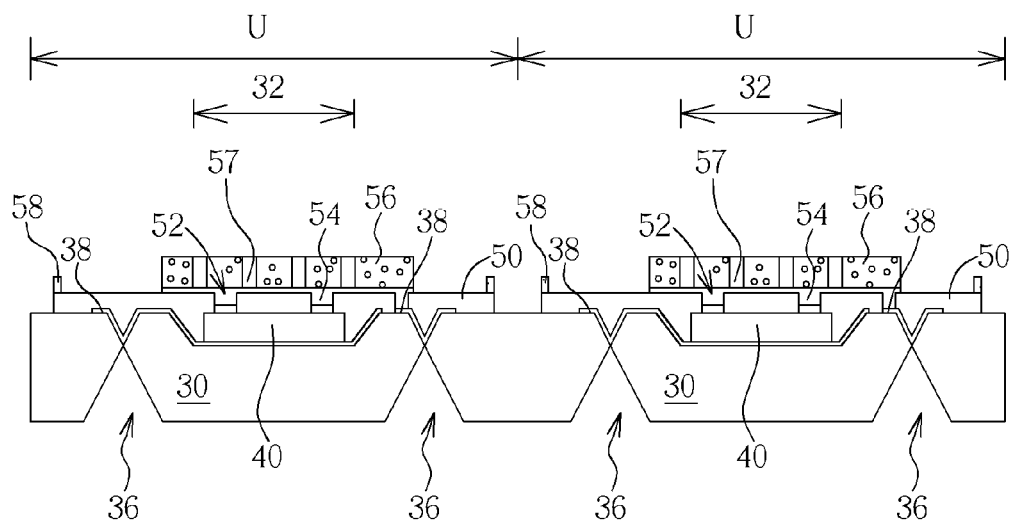

As shown in FIG. 5a and FIG. 5b, the previous mentioned phosphor layer 64 is next patterned by an exposure and development process, such that the phosphor layer 64 becomes a plurality of phosphor encapsulations 56. A plurality of light-through holes 57 may be simultaneously formed in each of the phosphor encapsulations 56 in the exposure and development process. Each of the phosphor encapsulations 56 locates on the corresponding LED chip 40, or disposed right above the corresponding LED chip 40. Each of the light-through holes 57 may evenly distribute within each of the phosphor encapsulations 56, and vertically penetrating each of the phosphor encapsulations 56, so that the planarization structure 50 or a portion of the LED chips 40 surface underneath the phosphor encapsulations 56 may be exposed. Since the light-through holes 57 have no phosphors 48, the existence of light-through holes 57 may decrease the amount of the phosphors 48 in the area, so as to alter the color temperature presented by the LED package. The cross-sectional area of the light-through holes 57 of each of the phosphor encapsulations 56 may be adjusted according to designs such as brightness of each the LED chips 40 and product requirement. The total cross-sectional area of the light-through holes 57 is preferably about 5% to 30% of that of the phosphor encapsulations 56.

One function of the phosphor encapsulations 56 is to transform the light color of a portion of light generated by the LED chips 40 into another color. For instance, the LED chips 40 in the present embodiment may be blue light LED chips, so phosphor materials that emit yellow light may be selected for the phosphor encapsulations 56. White light may be therefore produced by mixing blue light and yellow light. Alternatively, ultraviolet light LED chips may be used to excite blue light, green light or red light phosphors. It is to be noted that the material and the method of fabricating the phosphor encapsulations 56 are not limited.

Figure 5C:
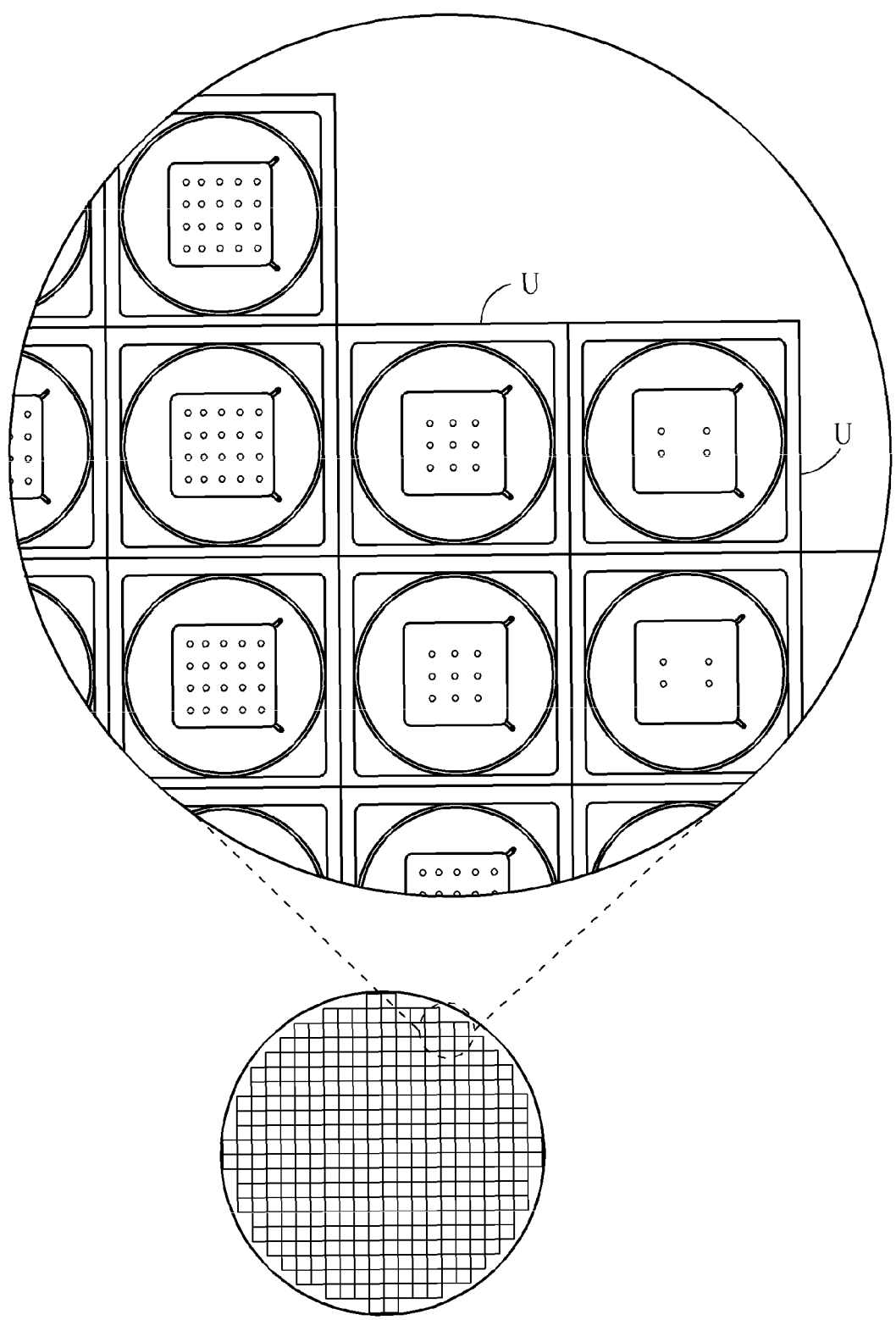

It is to be noted that, the shape, size or the percentage of the total area, the concentration/density and the distribution of the light-through holes 57 of each of the phosphor encapsulations 56 may be modified according to the concentration and distribution of phosphors 48 and the product requirement. Take the blue light LED chip package as an example, for a phosphor layer 64 formed by a spin coating process, when the phosphor encapsulations 56 have no light-through hole 57, the concentration/density of the yellow phosphors 48 in the central area of the substrate 30 tend to be higher than the concentration/density of the yellow phosphors 48 in the periphery area of the substrate 30 due to the spin coating process. Therefore, the intensity of the yellow light displayed by the LED chip package in the central area of the substrate 30 is undesirably stronger than that of the yellow light displayed by the LED chip package in the periphery area of the substrate 30. In this way, the LED chip packages formed in the same batch undesirably have different color temperature, and it is hard to control the color temperature of the LED chip packages. It is therefore in the present invention that after formation of the phosphor layer 64, the color temperature or the brightness displayed on any of the substrate 30 may be measured, and the measure results are later compared with the designed color temperature or the designed brightness of products. Consequently, the layout of the light-through holes 57 may be designed or be modified depending on the compared results to meet the designs by disposing the light-through holes 57. As shown in FIG. 5c, the proportion of the light-through holes 57 in the central area of the substrate 30 for example, is higher than that of the light-through holes 57 in the periphery area of the substrate 30. In other case, when there are concave areas on the superficial profile composed by the substrate 30, the LED chips 40 and/or the planarization structure 50, the concentration/density of the phosphors 48 in the concave area is usually higher than that in the planar area or the protruding area. Thus, the proportion of the light-through holes 57 in the concave area may be higher to balance the light intensity or light temperature.

Moreover, a plurality of closed circular patterns 58 may be formed on the planarization structure 50. Each of closed circular patterns 58 surrounds each of the chip mounting areas 32. The closed circular patterns 58 have a certain height, for instance several micrometers, and it functions as maintaining the surface tension of the encapsulant to be formed later on. The surface tension renders the encapsulation to have a hemisphere shape, and the hemisphere shape enables the encapsulation to be an optical lens. In this embodiment, the closed circular patterns 58 and the phosphor encapsulations 56 are preferably made of the same photosensitive material, and formed by the same lithography exposure and development process. In such a manner, the fabrication is simplified. However, this is not a limitation of the method in the present invention.

Figure 6A:
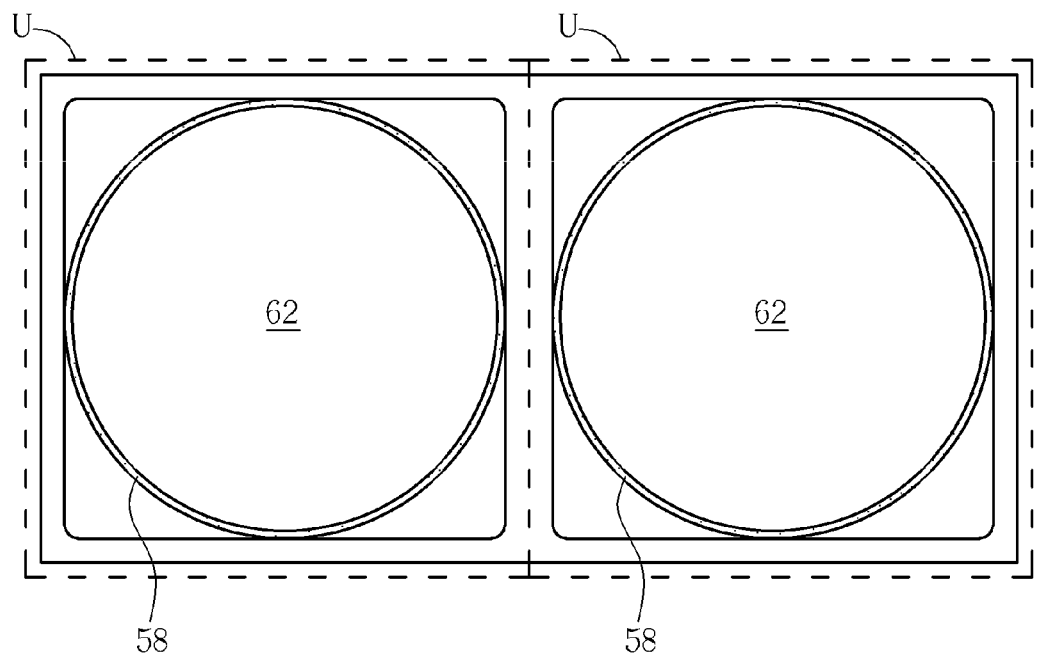
Figure 6B:
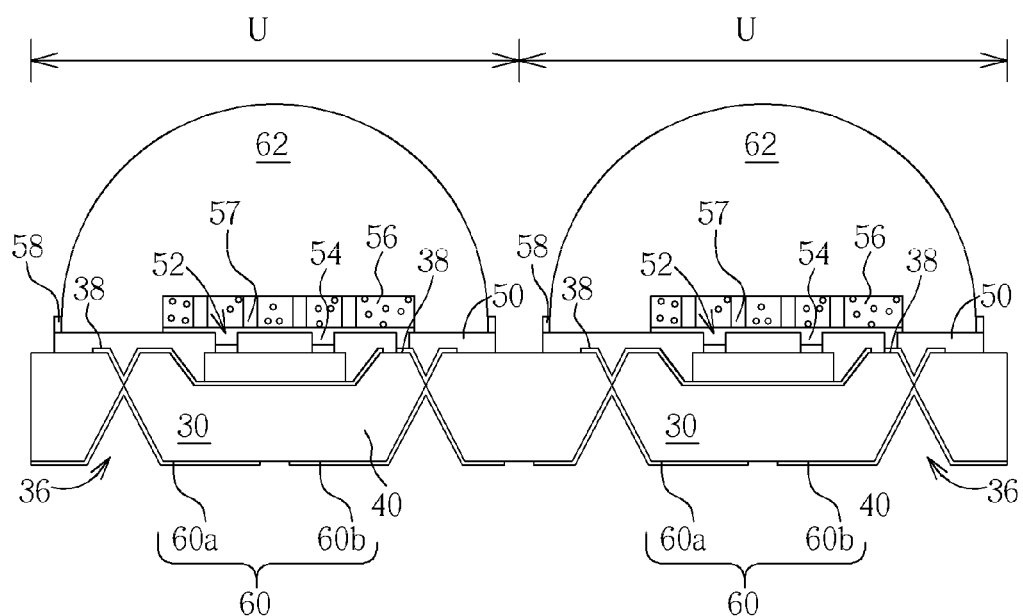

As shown in FIG. 6a and FIG. 6b, a glue dispensing process is thereafter performed. An encapsulation 62 is formed on each of the phosphor encapsulations 56 within each unit U.

The surface tension of the encapsulation 62 is maintained by the existence of the closed circular pattern 58, and the shape of the encapsulation 62 becomes hemisphere. The encapsulation 62 may form an optical lens after solidified. Subsequently, a segmentation process is performed to form a plurality of LED chip packages.

Figure 7:
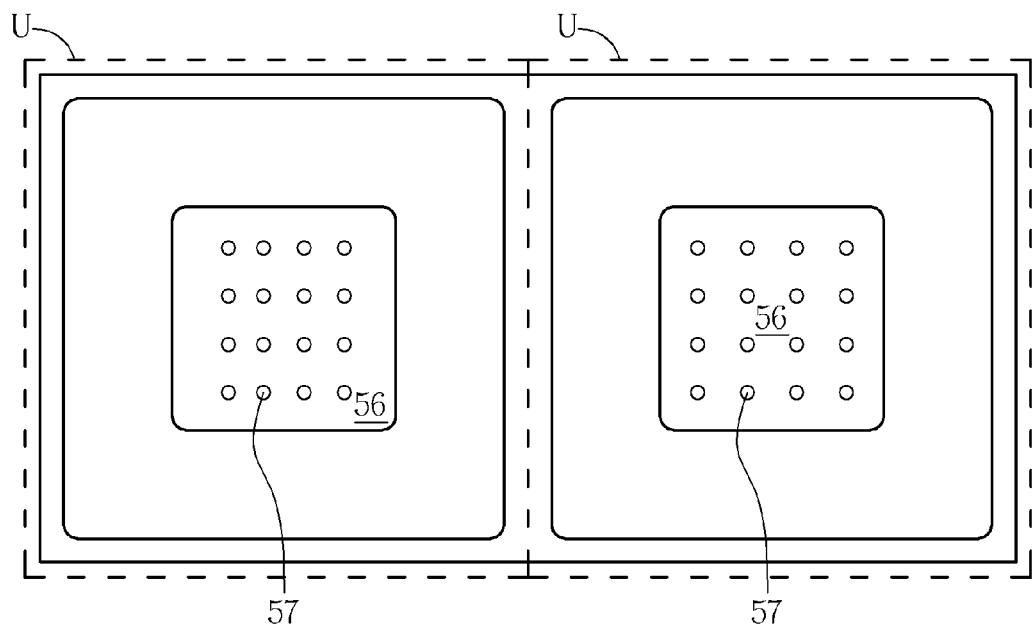
FIG. 7 and FIG. 8 are schematic views of fabricating an LED chip package according to another preferred embodiment of the present invention.
Figure 8:
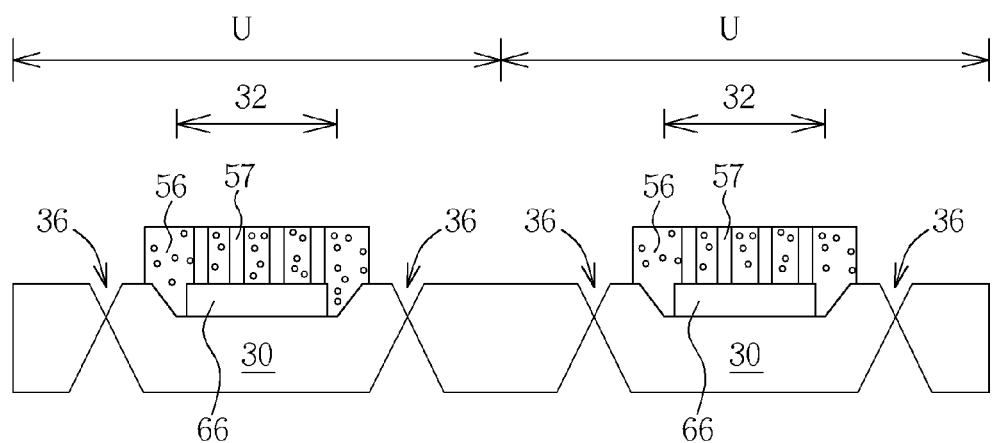

In the previously mentioned embodiment, the phosphor layer 64 is spin coated onto the surface of the planarization structure 50. Due to the planar characteristics of the planarization structure 50, the photosensitive glue 46 and the phosphors 48 may be smoothly and evenly spin coated onto the planarization structure 50 to form an uniform phosphor layer 64. In other embodiments, the planarization structure 50 may be excluded, and the photosensitive glue 46 and the phosphors 48 may be spin coated to a planar surface by other means. Please refer to FIG. 7 and FIG. 8. FIG. 7 and FIG. 8 are schematic views of fabricating an LED chip package according to another preferred embodiment of the present invention. FIG. 7 is a top view and FIG. 8 is a cross-sectional view. As shown in FIG. 7 and FIG. 8, after mounting the LED chips 66 within the chip mounting areas 32, the top surface of the LED chips 66 and the top surface of the substrate 30 are substantially in the same height. Subsequently, a spin coating process and a patterning process are further performed to form the phosphor encapsulations 56 with light-through holes 57. Various kinds of methods may be utilized to form the external electrical connection of the LED chips 66. The LED chip package may further include other elements or films that may enhance the reliability or the optic effect of the product. The detailed electrical connection condition, other elements or films are omitted in the figures.

The LED chip package in the present invention may use photosensitive material to form phosphor encapsulations, so the phosphor encapsulations may be formed and patterned in batch by semiconductor processes. The time required for LED chip package fabrication process is distinctly shortened, enhancing fabrication efficiency. Also, since light-through holes may be formed in the same step of patterning the phosphor encapsulations in the present invention, the concentration/density of the phosphors of the phosphor encapsulations may be precisely and easily adjusted. Therefore, the optic effect of the LED chip package may be enhanced, the color temperature produced by the LED chip package may be controlled to be the same or similar. In other embodiments, the LED chip packages formed in the same batch may be controlled to produce different color temperature.

Figure 9A:
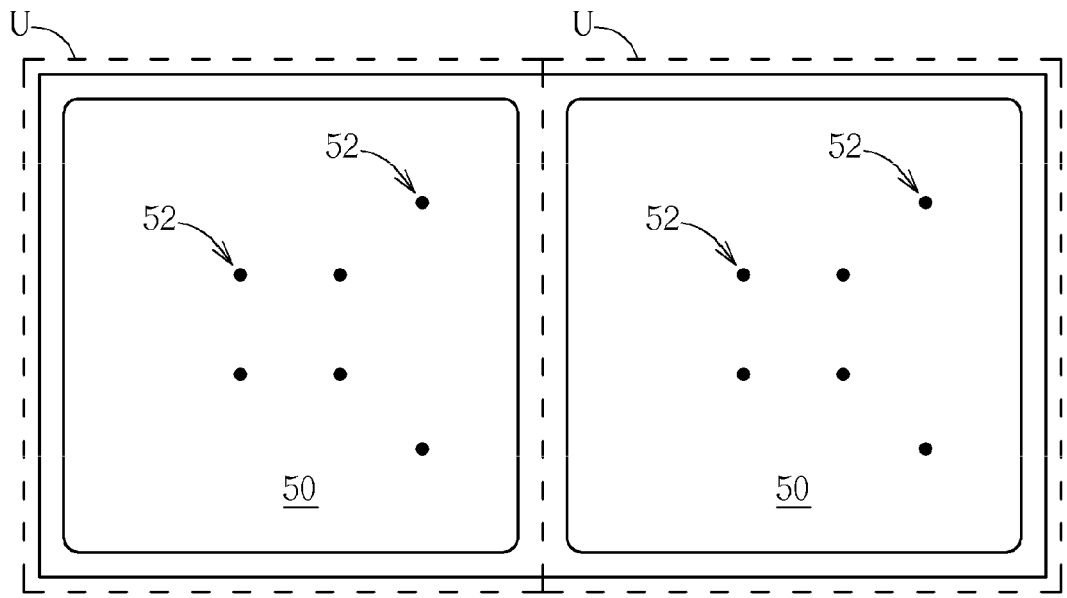
FIG. 9 to FIG. 11 are schematic views of fabricating an LED chip package according to still another preferred embodiment of the present invention.
Figure 9B:
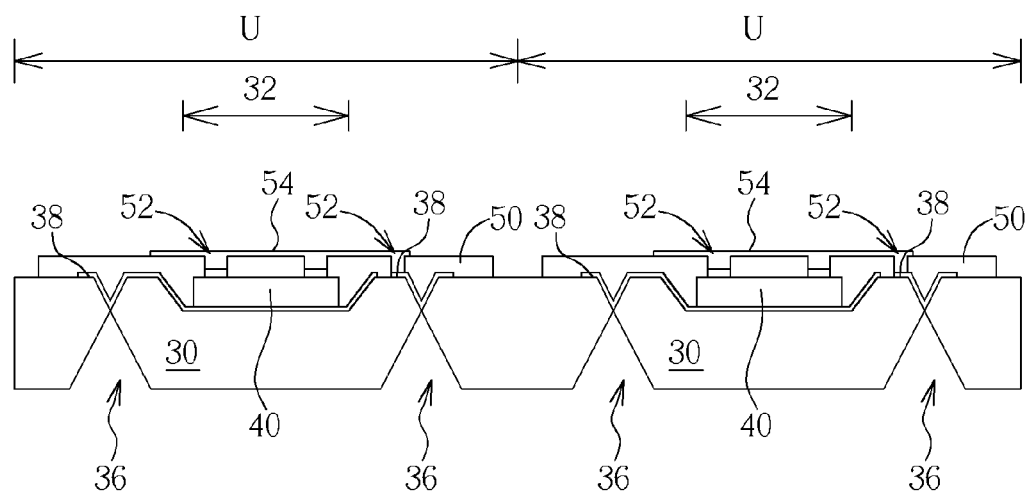

In addition to form uniform phosphor layers in batch by utilizing the spin coating process and the patterning process, a laser printing process may also be utilized to form uniform phosphor layer in batch in the present invention. Please refer to FIG. 9 to FIG. 11. FIG. 9 to FIG. 11 are schematic views of fabricating an LED chip package according to still another preferred embodiment of the present invention. FIG. 9a to FIG. 11a are top views, while FIG. 9b to FIG. 11b are cross-sectional views. As shown in FIG. 9a and FIG. 9b, a substrate 30 having a plurality of units U defined thereon and a plurality of LED chips 40 are provided at first. Each of the units U is for disposition of the corresponding LED 40. The substrate 30 may include a plurality of concave chip mounting areas 32 on its surface. The depth of the chip mounting areas 32 may preferably be approximately the height (thickness) of the LED chips that would be later mounted within them, but not limited. A light-penetrating planarization structure 50 may be selectively formed on the substrate 30 and the LED chips 40. The planarization structure 50 is dielectric and fills the spaces between the LED chips 40 and the chip mounting areas 32, and consequently a complete plane is formed on the package substrate 30 and the upper surface of the LED chips 40. The planarization structure 50 makes it easy to form successive conductive wires thereon. Alternatively, a conductive wire 54 may further be formed on the planarization structure 50 and fills the contact holes 52, so as to implement the electrical connection.

Figure 10A:
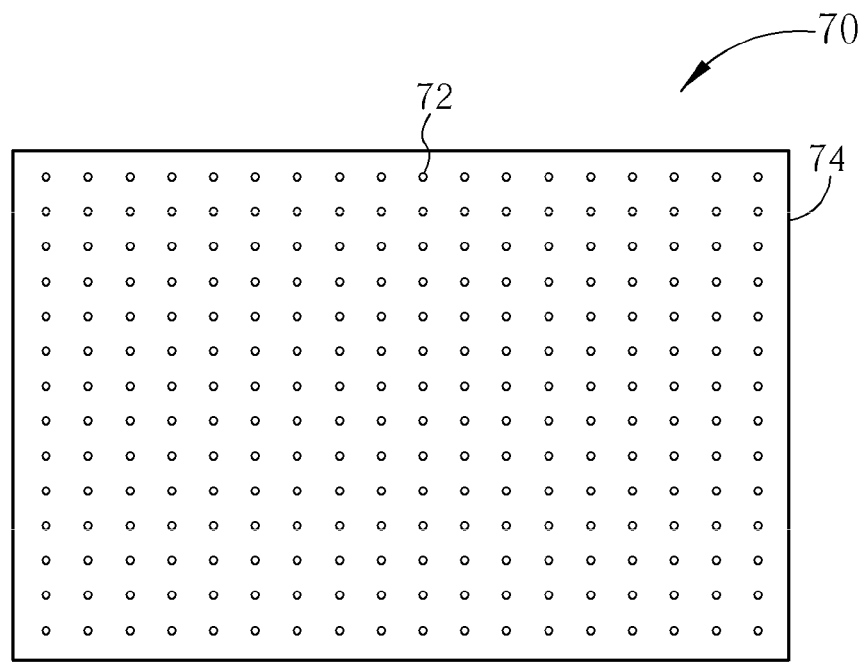
Figure 10B:
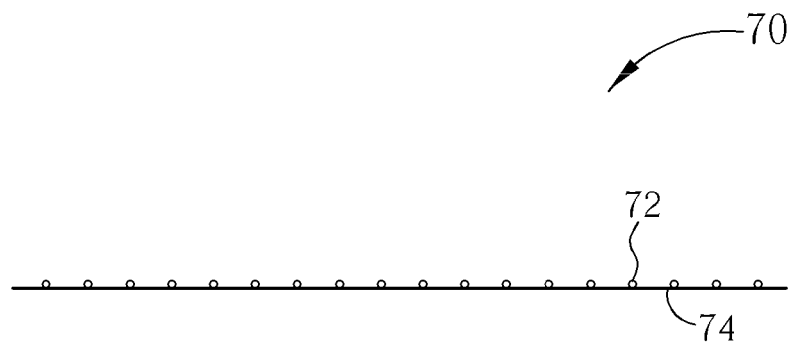
Figure 11A:
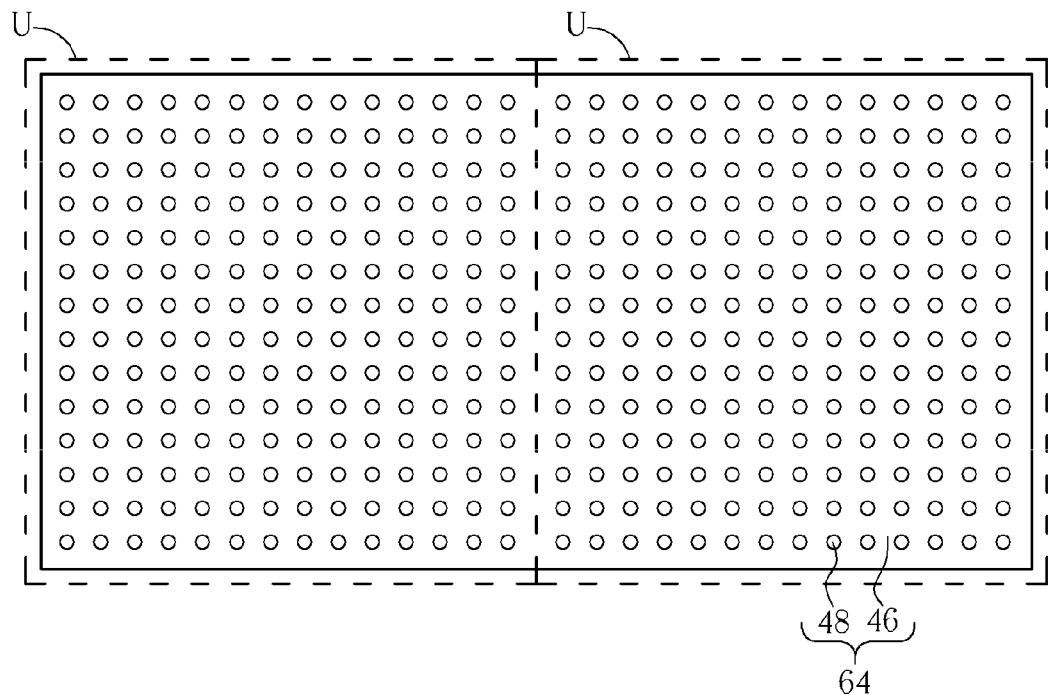
Figure 11B:
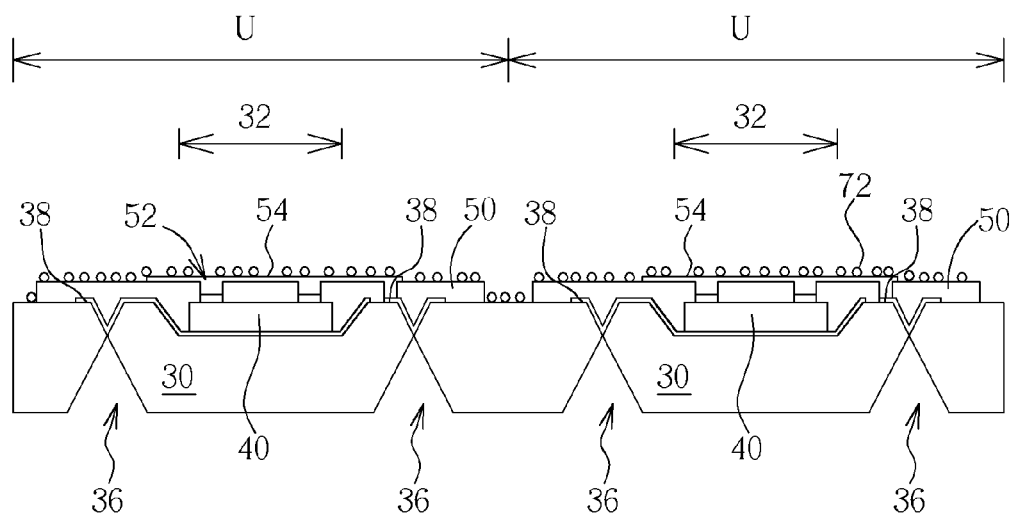

As shown in FIG. 10a and FIG. 10b, subsequently, at least a laser printing process is performed to form a phosphor film 70 having phosphors 72 thereon. For example, the formation of phosphor film 70 may project an electrostatic charge onto the photoreceptor, such as a revolving photosensitive drum or a revolving photosensitive belt, using a primary charge roller at first. Later, the phosphors 72 are absorbed by the electrostatic charge according to the predetermined patterns. Consequently, the phosphors 72 that present the predetermined patterns are transferred onto a photosensitive dry film 74, so as to form a required phosphor film 70.

When viewing from side, the phosphors 72 of a single phosphor film 70 are arranged in single layer and not stacked in a vertical direction due to the characteristics of laser printing. When viewing from the top, the resolution of the laser printing process can reach about 50 micrometers or less, therefore the distribution of the phosphors 72 may be controlled to form any predetermined patterns, and not limited to the pattern in FIG. 10a and FIG. 10b. The concentration/density of the phosphors 72 in any area on the phosphor film 70 may also be controlled. For example, the phosphors 72 may evenly distribute on the entire phosphor film 70, or merely on the chip mounting areas 32 of the substrate 30. In other embodiments, when considering a single LED chip package, the illumination intensity is usually stronger right above the LED chips 40 then the illumination intensity in the periphery of the LED chips 40. Therefore, the concentration/density of the phosphors 72 of the phosphor film 70 right on top of the LED chips 40 may be higher, and the concentration/density of the phosphors 72 of the phosphor film 70 in the periphery of the LED chips 40 may be lower.

As shown in FIG. 11a and FIG. 11b, a hot embossing process is used to transfer the phosphors 72 of the phosphor film 70 onto the LED chips 40 to form a phosphor layer 76. Accordingly, the phosphors 72 of a single phosphor layer 76 would be arranged in a single layer rather than stacking in a vertical direction and the concentration/density of the phosphors 72 in any area of the LED chips 40 may also be controlled precisely.

In other embodiments of the present invention, the previously mentioned laser printing process and the previously mentioned transfer step, also known as the hot embossing process, may be performed repeatedly to form a plurality of phosphor layers 76 on the LED chips 40. The laser printing process facilitates the accurate layout of the tiny phosphors 72 which are adjacent to each other or are overlapped to each other. Through the subtle patterns and multiple concentration/density arrangement, a uniformed color temperature for observers may be obtained.

In sum, since the LED chip package of the present invention may utilize photosensitive material to form phosphor encapsulations or phosphor layers, the phosphor encapsulations or the phosphor layer may be formed in batch by the semiconductor processes, and the present invention can effectively elevate the efficiency of LED chip package process. In addition, since the phosphors concentration/density distribution of the phosphor encapsulations or the phosphor layers in the present invention may be accurately and easily controlled by utilizing an exposure and development process or a laser printing process, therefore the optic effect of the LED chip package may be accurately adjusted.

Those skilled in the art will readily observe that numerous modifications and alterations of the device and method may be made while retaining the teachings of the invention.

What is claimed is:

1. A method of fabricating a light emitting diode (LED) chip package, comprising:
   providing a substrate, and a plurality of LED chips mounted on the substrate;
   forming an phosphor layer disposed on the substrate and on the LED chips; and
   patterning the phosphor layer to turn the phosphor layer into a plurality of phosphor encapsulations on the LED chips and to form a plurality of light-through holes penetrating each of the phosphor encapsulations vertically, wherein the plurality of phosphor encapsulations and the plurality of light-through holes are simultaneously formed in the patterning step.

2. The method of claim 1, wherein the phosphor layer comprises a photosensitive glue blended with a plurality of phosphors in the photosensitive glue.

3. The method of claim 1, wherein the phosphor layer is formed by a spin coating process.

4. The method of claim 1, wherein the step of patterning the phosphor layer is performed by an exposure and development process.

5. The method of claim 1, wherein a total cross-sectional area of the light-through holes of each of the phosphor encapsulations is substantially 5% to 30% of a total cross-sectional area of each of the phosphor encapsulations.

6. The method of claim 1, wherein the substrate comprises a semiconductor substrate.

7. The method of claim 1, wherein the substrate comprises a plurality of concave chip-mounting areas on an upper surface of the substrate, and the LED chips are mounted within the chip-mounting areas.

8. The method of claim 1, further comprising a step of providing a planarization structure before forming the phosphor layer, wherein the planarization structure covers the substrate and surfaces of the LED chips.

9. The method of claim 8, wherein the phosphor layer is formed on a surface of the planarization structure.

10. The method of claim 1, wherein the light-through holes are evenly dispersed in each of the phosphor encapsulations, and the LED chips are exposed by a portion of the light-through holes.

* * * * *